United States Patent [19]

Craig

[11] Patent Number: 4,865,197

[45] Date of Patent: Sep. 12, 1989

[54] ELECTRONIC COMPONENT TRANSPORTATION CONTAINER

[75] Inventor: David J. Craig, Livingston, Scotland

[73] Assignee: Unisys Corporation, Blue Bell, Pa.

[21] Appl. No.: 187,764

[22] Filed: Apr. 29, 1988

[30] Foreign Application Priority Data

Mar. 4, 1988 [GB] United Kingdom ............... 8805179

[51] Int. Cl.$^4$ ............................................. B61D 81/14
[52] U.S. Cl. ........................................ 206/328; 206/522
[58] Field of Search ................. 206/328, 522, 521, 594

[56] References Cited

U.S. PATENT DOCUMENTS

| | | | |
|---|---|---|---|
| 4,160,503 | 7/1979 | Ohlbach | 206/328 |
| 4,241,829 | 12/1980 | Hardy | 206/328 |
| 4,609,104 | 9/1986 | Kasper et al. | 206/328 |
| 4,707,414 | 11/1987 | Long et al. | 206/328 |

*Primary Examiner*—Joseph Man-Fu Moy

*Attorney, Agent, or Firm*—Albert B. Cooper

[57] ABSTRACT

A transportation container (68,44) for transporting items or enclosures (72) requiring electrostatic protection includes a box (44) lined with electrically conductive bubble layer material (58) which protrudes from open seams (66) and which is also electrically accessible through an aperture (28) in registration with an opening (42) when the box (44) is contained within the sleeve (68). The accessibility of the electrically conducting bubble sheet material (58) allows for either deliberate discharge to ground potential of the bubble material (58) via the aperture (28) or provides ample opportunity for accidental discharge to ground by virtue of protrusion of the bubble material (58) through the open seams (66). The bubbles of the material (58) distort and burst to accommodate a range of enclosures from very small to quite large by virtue of the fact that the tips of the bubbles (62) just touch without compression when the box (44) is closed.

6 Claims, 3 Drawing Sheets

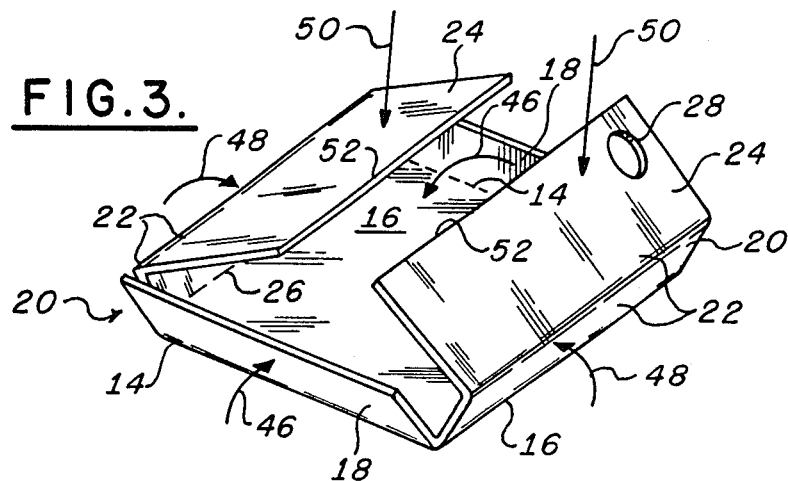
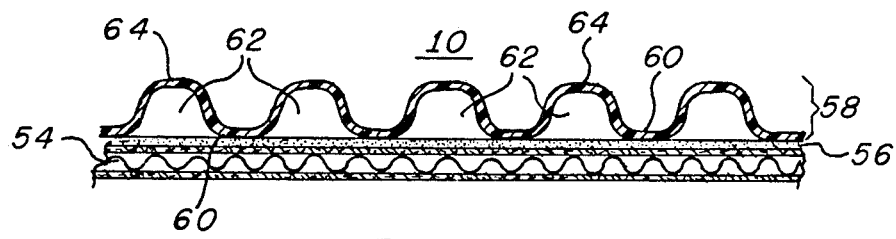
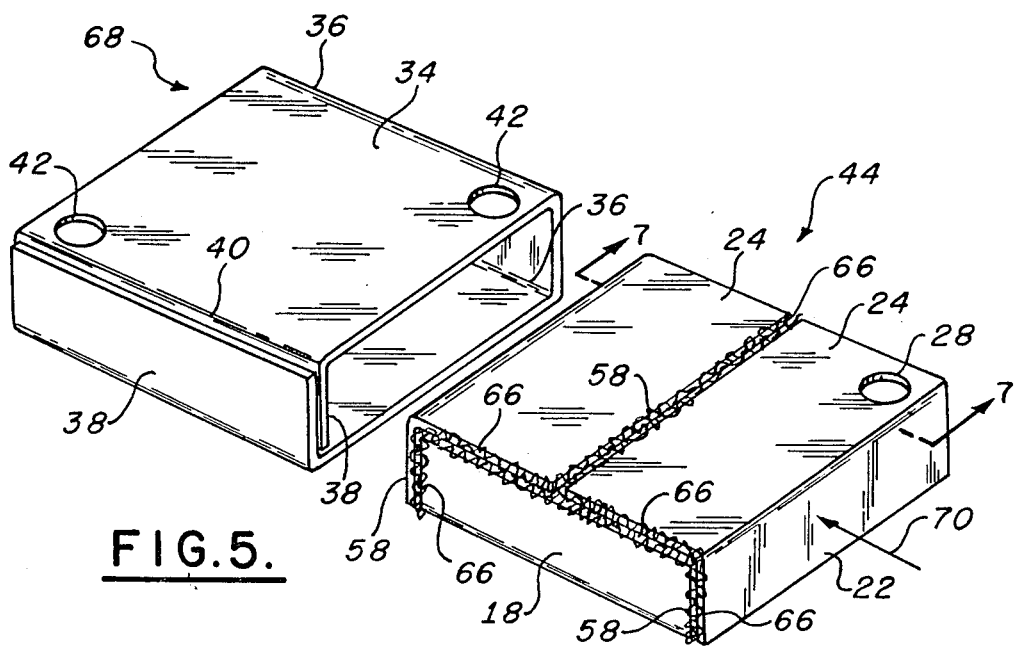

ELECTRONIC COMPONENT TRANSPORTATION CONTAINER

BACKGROUND OF THE INVENTION

The present invention relates to a transportation container for electronic components. It particularly relates to such a container suitable for sending through the mail. In greatest particularity it relates to a container for components requiring electrostatic shielding during transportation.

Electronic components nowadays comprise a large number of metal oxide silicon (MOS) devices which are sensitive to electrostatic discharge. A few hundred volts discharging to a portion of an integrated circuit or a board bearing such an integrated circuit can cause instantaneous failure of an electronic device. Such discharges are invisible and frequent in most environments which would, for all other purposes, be considered normal. Accordingly, it is necessary to apply stringent electrostatic precautions when handling integrated circuits or electronic component boards of this type.

It is necessary for repair and maintenance of equipment to send replacement boards to service personnel to replace damaged boards in equipment. No matter how careful the packers may be to avoid electrostatic damage to the board, there is no guarantee that circumstances during transit or precautions taken when the transportation container is opened will not place the board at risk of destruction by electrostatic discharge. Accordingly, the present invention seeks a low-cost transportation container generally suitable for use with all types and sizes of electronic components or circuit boards wherein the risk of electrostatic discharge during transit or unpacking is minimized.

The present invention consists in a transport container for electronic components comprising: an inner box having as elements, a base, first and second sides, first and second ends, and a lid; said box being formed from a single, planar sheet by folding; said planar sheet having an electrically conductive, continuous, elastic layer on a face thereof; said container further having a conforming outer sleeve for holding closed said box when said sheet is folded to form said box; where, when said sheet is folded to form said box, said face of said sheet forms the inside surface of said box; and where said layer deforms along abutting edges of said elements to seal open seams between said elements to cause the interior of said box to be completely surrounded by electrically conductive material.

The different shipping requirements for electronic components mean that sometimes a very small item must be shipped and at other times a bulky item must be shipped. In order readily to accommodate any size of item the preferred embodiment of the present invention provides that, when the box is closed with no enclosure therein, the surface of the layer on the lid is in uncompressed tangency with the surface of the layer on the base. This means that, should a very tiny item be placed within the box, it will still be gripped and held in place by the electrically conductive layer on the lid pushing against the electrically conductive layer on the base. On the other hand, when a larger item is placed within the box, the layer elastically deforms to accommodate the item.

Use of foam and foam blocks within boxes requires careful sculpting of the foam and adds to the cost of construction of the transportation container. In order to overcome the problems associated with foam, the present invention provide a transportation container wherein the electrically conductive layer is a bubble sheet with a flat side on the face of the folded sheet and a plurality of gas filled bubbles protruding from the face of the sheet. The present invention further provides in its preferred embodiment that the bubbles can burst to accommodate any prominences in any enclosure. The bursting of bubbles creates a cavity wherein the prominence is accommodated and held in place by adjacent unburst bubbles. The item having such prominences is thus immobilized and held in place in the box and the bubble layer automatically comes into conformity with the surface of the enclosure either by deformation of the gas filled bubbles or by actual bursting of bubbles.

When a transportation container is unpacked, the interior of the box has, up until that time, formed a Faraday cage (i.e. a space completely surrounded by electrically conductive material) wherein no electrostatic field can form. As soon as the enclosure is removed from its Faraday cage, it rapidly assumes the voltage of the surface of the cage. Should the voltage on the surface of the cage be markedly different from the voltage or electrical potential of the surroundings where the transportation container is open, as soon as the enclosure is brought into proximity with the surroundings a spark can pass and destroy the electronic item, now unpacked. Accordingly it is important that the conductive layer be brought to the same electrical potential as its surroundings when the transportation container is opened. Accordingly the preferred embodiment provides that the electrically conductive layer, at any sealed open seam in the box, protrudes from the open seam to allow electrical contact therewith. This electrical contact can either be deliberate (in the case of a careful operative opening the box) or can be accidental. The present invention provides the maximum opportunity for accidental contact between the electrically conductive layer and the operator so that, should the operator (who is generally grounded) forget to discharge the electrically conductive layer to ground, there is still ample opportunity for accidental discharge of the electrically conductive layer to have taken place.

Further to facilitate discharge of the electrically conductive layer, the present invention provides that the box has an aperture in the folded sheet which allows access to the electrically conductive layer. In the preferred embodiment the sleeve has an opening and the opening comes into registration with the aperture when the box is in the sleeve. Direct access to the electrically conductive layer may thus be made through the sleeve even when the box is closed. This allows touching of the layer with a grounded probe or other instrument before the box is opened. In the preferred embodiment of the present invention the sleeve has a plurality of openings so that the aperture in the box can engage one of the plurality of openings whichever one of the plurality of orientations is used to insert the box into the sleeve.

DESCRIPTION OF THE DRAWINGS

The present invention is further explained, by way of an example, by the following description taken in conjunction with the appended drawings; in which:

FIG. 3 shows the manner in which the cut sheet of FIG. 1 is folded to form the inner box.

FIG. 4 shows a cross sectional view through the sheet of FIGS. 1 and 3 showing the provision of an electrically conductive bubble sheet on one face thereof.

FIG. 5 shows the assembled and folded outer sleeve, the assembled and folded inner box, and further shows how the box is inserted into the sleeve.

DESCRIPTION OF THE INVENTION

Figure 1:
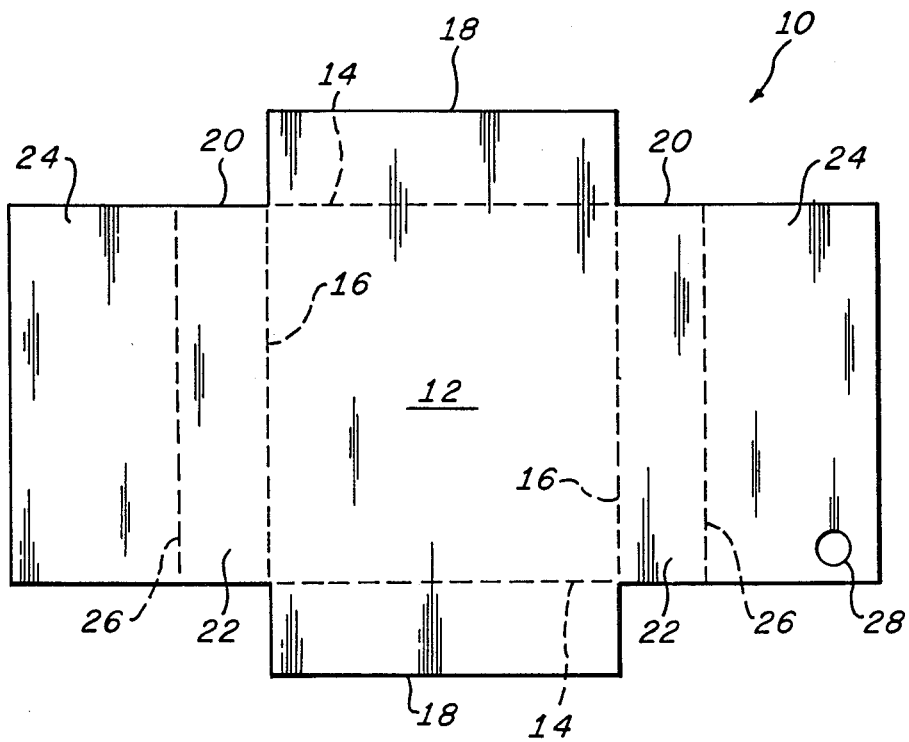
FIG. 1 shows a plan view of a sheet cut and ready to be folded to form the inner box.

FIG. 1 shows the plan view of a sheet cut and ready to be folded to form the inner box.

The box sheet 10 has a rectangular base portion 12 having first and second edge fold lines 14 and first and second end fold lines 16. First and second side flaps 18 are joined to the base 12 along the first and second edge fold lines 14 and first and second end flaps 20 are joined to the base 12 along the first and second end fold lines 16. Each end flap 20 comprises a box end portion 22 and a lid portion 24. The box end portion 22 in each instance is immediately adjacent to the end fold line 16 and the box end portion 22 abuts the lid portion 24 along a lid fold line 26. When folded, the sheet 10 of FIG. 1, as is hereinafter described, forms a box. An aperture 28 is provided in one of the lid portions 24.

Figure 2:
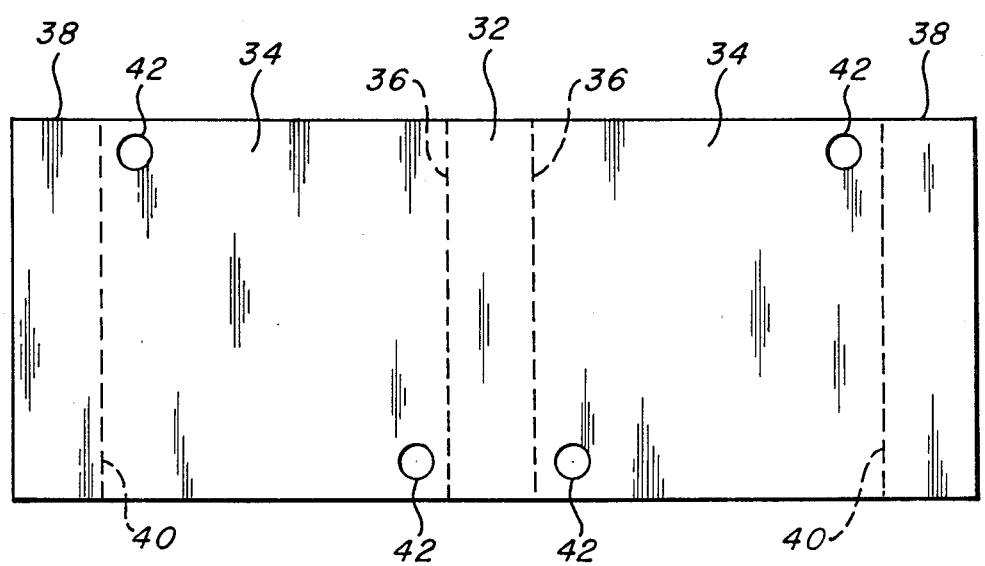
FIG. 2 shows a plan view of a sheet cut and ready to be folded to form the outer sleeve.

FIG. 2 shows a plan view of a sleeve sheet cut and generally ready to be formed into the conformal sleeve. A central side portion 32 is joined on either side to face portion 34 along fold lines 36. In turn, each face portion 34 is joined to a respective end portion 38 along a respective end fold line 40. Apertures 42 in the face portions 34 are used to provide registration with the aperture 28 in a manner hereinafter described.

FIG. 3 shows how the planar sheet of FIG. 1 is folded to form the inner box 44. With the base portion 12 remaining fixed, the first and second side flaps 18 are folded along the first and second edge fold lines 14 as indicated by first arrows 46 to form sides of the box 44. The first and second end flaps 20 are folded along the first and second end fold lines 16 as indicated by second arrows 48 to form the endsd of the box 44. At the same time the lid portions 24 are folded with respect to the end portions 22 along the lid fold lines 26 as indicated by third arrows 50 to form an enclosed box wherein edges 52 of the lid portions 24 come into approximate abutment when the two lid areas 24 become co-planar.

FIG. 4 shows a cross sectional view of the box sheet 10. A corrugated cardboard substrate 54 has a glue layer 56 applied to one face thereof and a conductive polymer bubble layer 58 held onto the corrugated cardboard substrate 54 by the glue layer 56. The bubble layer 58 comprises a flat face 60 in contact with the glue layer 56 and a plurality of bubbles 62 in contiguous array each containing trapped gas and formed by the presence of a top polymer sheet 64 adhering to the flat face 60 of the bubble layer 58 to form the bubbles 62. The top polymer sheet 64 is generally plastic in nature and allows the bubbles 62 to change shape when pressure is applied to each individual bubble 62. The bubbles 62 can move sideways, be flattened towards the flat face 60, and, should pressure increase beyond a predetermined limit, one bubble 62 can burst into an adjacent bubble 62, or a bubble 62 can burst altogether releasing its contained gas.

FIG. 5 shows the box 44 completely closed. Wherever one edge of the box sheet 10 is brought into proximity with another edge of the box sheet 10, an open seam 66 is formed. That is to say, were compressed air to be introduced into the closed box of FIG. 5, the open seams 66 are those lines of joining where-through gas would escape (ignoring the aperture 28 which is sealed by the conductive layer 60). However, the bubble layer 58 is sufficiently elastic that the material of the bubble layer 58 is compressed and fills the open seams 66 and further, as shown in FIG. 5, a small portion of the bubble layer 58 protrudes through the open seams 66. The assembled box 44 is inserted into the assembled sleeve 68 as generally indicated by a fourth arrow 70. The sleeve 68 is formed by bending the face portions 34 relative to the central side portion 32 along the fold lines 36 so that the face portions 34 are parallel to one another. The end portions 38 are then folded along the fold lines 40 to be at a right-angle to their respective face portions 34. The two end portions 38 are then glued together. This forms the sleeves 68 which conforms with the closed box 44.

Figure 6:
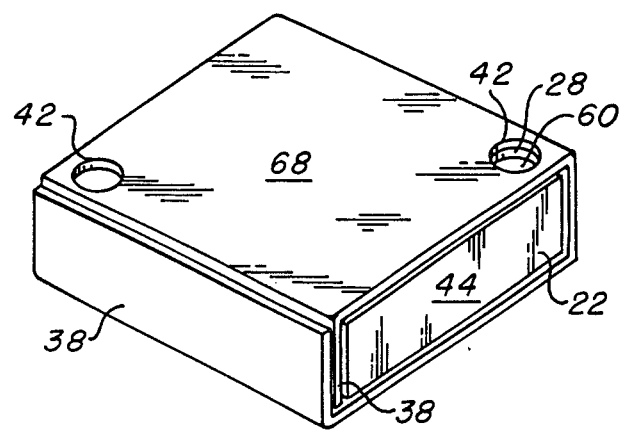
FIG. 6 shows the box contained within the sleeve.

FIG. 6 shows the box 44 contained within the sleeve 68. The aperture 42 comes into registration with the aperture 28 where indicated in FIG. 6. Had the box 44 been placed in the sleeve 68 upsidedown or back-to-front one of the apertures 42 would have come into registration with the aperture 28. The conductive flat face 60 of the bubble layer 58 is accessible through the aperture 42 in registration with the aperture 28.

Figure 7:
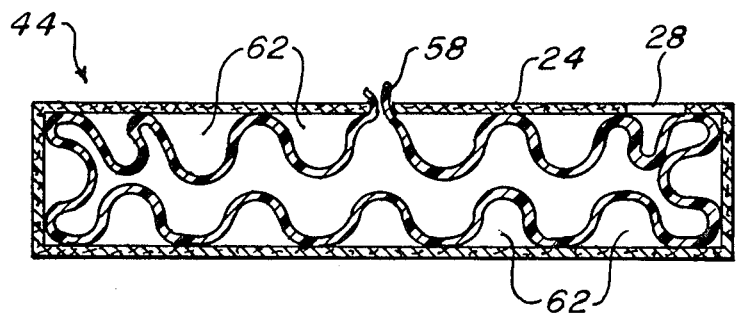
FIG. 7 shows a cross sectional view of the box of FIG. 5 taken along the line XX'.

FIG. 7 shows a cross sectional view of the box 44 of FIG. 5 taken along the line XX' looking in the direction of the arrows. It is seen that the tops of the bubbles 62 just meet within the centre of the box 44. At this stage they are substantially uncompressed. That is to say, any compression of the bubble 62 is very slight. Should an item of even microscopic thickness be provided as the enclosure in the box 44 it would be gripped between the bubbles 62 along the center line.

Figure 8:
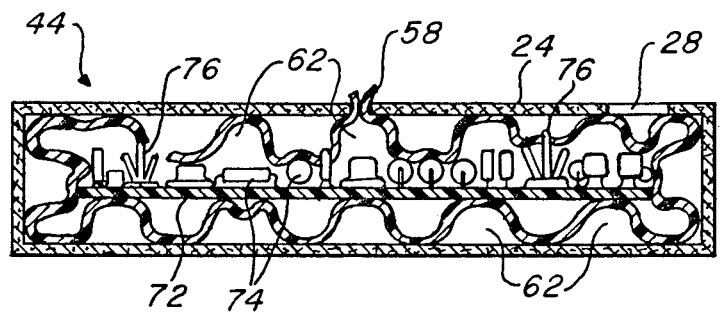
FIG. 8 shows the cross sectional view of FIG. 7 with a printed wiring board as the enclosure for the transportation container.

FIG. 8 shows the cross sectional view of FIG. 7 with a printed wiring board 72 held between the bubbles 62. The bubbles 62 are generally elastically deformed by components 74 on the printed wiring board 72. The components 74 and the printed wiring board 72 are thus gripped within the bubbles 62. The deformation of the bubbles 62 means that no movement of the printed wiring board 72 is possible relative to the bubbles 62. At the same time, should the printed wiring board 72 or enclosure contain any prominences such as heat sinks 76, here illustrated by way of example, the prominences 76 can either burst the bubbles 62 automatically to form a cavity for their accommodation or can squeeze between bubbles 62 as shown in FIG. 8. Either way, the prominences 76 form a cavity for themselves among the bubbles 62 completely surrounded by other bubbles 62. The prominences 76 are thus locked into place further providing that the printed wiring board 72 cannot move.

When the transportation enclosure of FIG. 6 is received at a destination where it is to be unpacked, it is intended that the unpacking operative should first provide electrical connection to electrical ground by touching the bubble layer 58 through the aperture 42 and the aperture 28 either with his own finger (should he be grounded) or using a grounded probe. However, should the operative inadvertently forget to discharge the bubble layer 58 to ground potential, the protruding bubble layer 58 from the open seams 66 provide ample opportunity that accidental contact between the operators hands and the bubble layer 58 will be made before the box 44 is opened.

The general deformability and burstability of the bubbles 62 means that any item or enclosure can be accommodated within the box 44 ranging in thickness and size from tiny individual integrated circuits, pins and the like right up to thick printed wiring boards containing many components. In either case, the item or enclosure is firmly gripped and the box 44 is simply closed without the necessity for any modification to the box 44.

The material for the sleeve sheet of FIG. 2 is conveniently chosen to be the same corrugated cardboard substrate used for the box sheet 10 but without the bubble layer 58 applied. It is to be understood that the substrate 54 of the box sheet 10 and the material of the sleeve sheet can be conveniently selected among those materials known in the art having the properties of being formed into thin sheets capable of folding.

The items contained within the box 44, being completely surrounded by an electrically conductive layer, are effectively within a Faraday cage wherein no electrostatic field can exist. Also, being so surrounded, the components are protected from radio frequency and other potentially damaging fields from extraneous energy sources.

What is claimed is:

1. A transportation container for electronic components comprising: an inner box having, as elements, a base, first and second sides, first and second ends, and a lid; said box being formed from a single planar sheet by folding; an electrically conductive, continuous, elastic layer on a surface of said planar sheet; said container further comprising a conforming outer sleeve for holding closed said box when said sheet is folded to form said box, said face of said sheet having said elastic layer forms the inside surface of said box; and where said layer deforms along abutting edges of said elements seals open seams between said elements to cause the interior of said box to be completely surrounded by electrically conductive material, wherein said layer is a bubble sheet with a flat side on said face of said sheet and a plurality of gas-filled bubbles protruding said face of said sheet.

2. A transportation container according to claim 1 where, when said box is closed with no enclosure therein, the surface of said layer on said lid is in uncompressed tangency with the surface of said layer on said base.

3. A transportation container according to claim 1 wherein bubbles can burst to accommodate prominences on any enclosure.

4. A transportation container according to claim 3 wherein said layer, at any open seam in said box, protrudes from the open seam to allow electrical contact therewith.

5. A transportation container for electronic components comprising: an inner box having, as elements, a base, first and second sides, first and second ends, and a lid; said box being formed from a single planar sheet by folding; an electrically conductive, continuous, elastic layer on a surface of said planar sheet; said container further comprising a conforming outer sleeve for holding closed said box when said sheet is folded to form said box, said face of said sheet having said elastic layer forms the inside surface of said box; and where said layer deforms along abutting edges of said elements seals open seams between said elements to cause the interior of said box to be completely surrounded by electrically conductive material,
wherein said box has an aperture in said sheet allowing access to said layer, and wherein said sleeve has an aperture coming into registration with said aperture in said box when said box is in said sleeve; whereby said layer may have electrical contact made there-with when said box is in said sleeve.

6. A transportation container according to claim 5 wherein said sleeve has more than one aperture; whereby said box may be inserted into said sleeve in any one of a plurality of orientations; and still provide access to the aperture in said box.

* * * * *